US012687590B2

(12) United States Patent
Lu et al.

(10) Patent No.: US 12,687,590 B2
(45) Date of Patent: Jul. 21, 2026

(54) BATTERY MONITORING SYSTEM FOR BIPOLAR BATTERIES

(71) Applicant: GM GLOBAL TECHNOLOGY OPERATIONS LLC, Detroit, MI (US)

(72) Inventors: Yong Lu, Shanghai (CN); Meiyuan Wu, Shanghai (CN); Zhe Li, Shanghai (CN); Dave G. Rich, Sterling Heights, MI (US); Haijing Liu, Shanghai (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 384 days.

(21) Appl. No.: 18/361,288

(22) Filed: Jul. 28, 2023

(65) Prior Publication Data

US 2024/0272236 A1     Aug. 15, 2024

(30) Foreign Application Priority Data

Feb. 14, 2023     (CN) .......................... 202310119970.2

(51) Int. Cl.
  *G01R 31/396*          (2019.01)
  *G01R 31/3835*         (2019.01)
      (Continued)
(52) U.S. Cl.
  CPC ....... *G01R 31/396* (2019.01); *G01R 31/3835* (2019.01); *H01M 10/46* (2013.01);
      (Continued)
(58) Field of Classification Search
  CPC . G01R 31/396; G01R 31/3835; H01M 10/46; H01M 10/482; H01M 50/296;
      (Continued)

(56) References Cited

U.S. PATENT DOCUMENTS 9,979,045 B2      5/2018  He et al.
2013/0130082 A1*  5/2013  Miyazaki .......... H01M 10/0418
                                          429/91

(Continued)

FOREIGN PATENT DOCUMENTS

JP        201837247 A      3/2018
WO    WO-2018149537 A1     8/2018

OTHER PUBLICATIONS

German Office Action for German Application No. 10 2023 105 768.5 dated Aug. 28, 2023.

*Primary Examiner* — Daniel R Miller

(57)          ABSTRACT

A bipolar battery system includes N battery cells. Each of the N battery cells comprises M cores each comprising a first current collector, cathode active material, a separator, anode active material, and a second current collector, where M is an integer greater than one. The M cores are connected in parallel by connecting the first current collectors of the M cores in each of the N battery cells together and by connecting the second current collectors of the M cores in each of the N battery cells together. N−1 clad plates are arranged between adjacent ones of the N battery cells and the N battery cells are connected in series by the N−1 clad plates. A voltage sensing system connects to the N−1 tabs, a first terminal, and a second terminal and is configured to determine N voltages across the N battery cells, respectively.

20 Claims, 5 Drawing Sheets

(51) Int. Cl.

| | | |
|---|---|---|
| *H01M 10/46* | (2006.01) | |
| *H01M 10/48* | (2006.01) | |
| *H01M 50/296* | (2021.01) | |
| *H01M 50/512* | (2021.01) | |

(52) U.S. Cl.
CPC ....... *H01M 10/482* (2013.01); *H01M 50/296* (2021.01); *H01M 50/512* (2021.01)

(58) Field of Classification Search
CPC .......... H01M 50/512; H01M 10/0418; H01M 50/569; H01M 10/48; H01M 50/289; H01M 50/503; H01M 50/51
See application file for complete search history.

(56) References Cited

U.S. PATENT DOCUMENTS

| | | | | |
|---|---|---|---|---|
| 2016/0020481 | A1* | 1/2016 | He ................... | H01M 10/0418 |
| | | | | 429/185 |
| 2019/0157636 | A1* | 5/2019 | Miler ................... | H01M 50/30 |
| 2022/0407120 | A1* | 12/2022 | Suzuki ............. | H01M 10/0562 |

* cited by examiner

FIG. 7
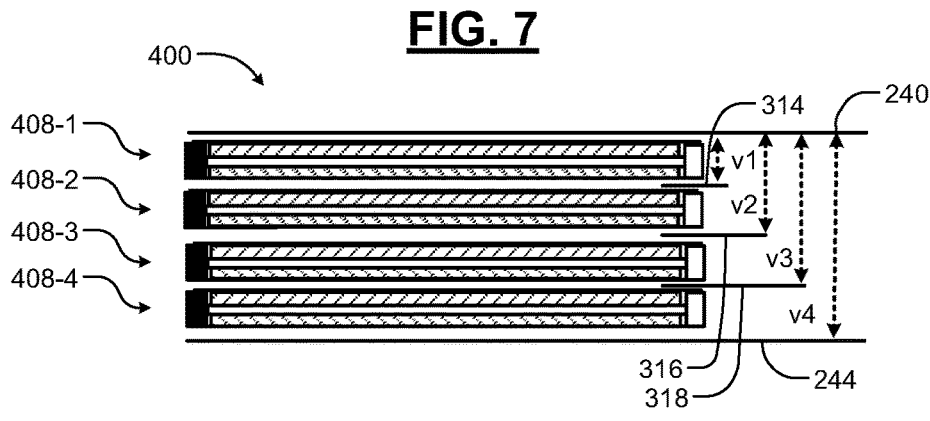
FIG. 8
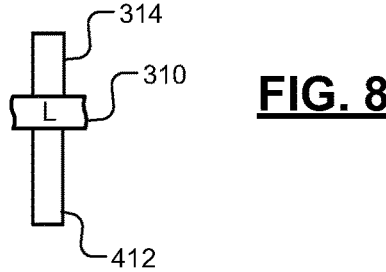
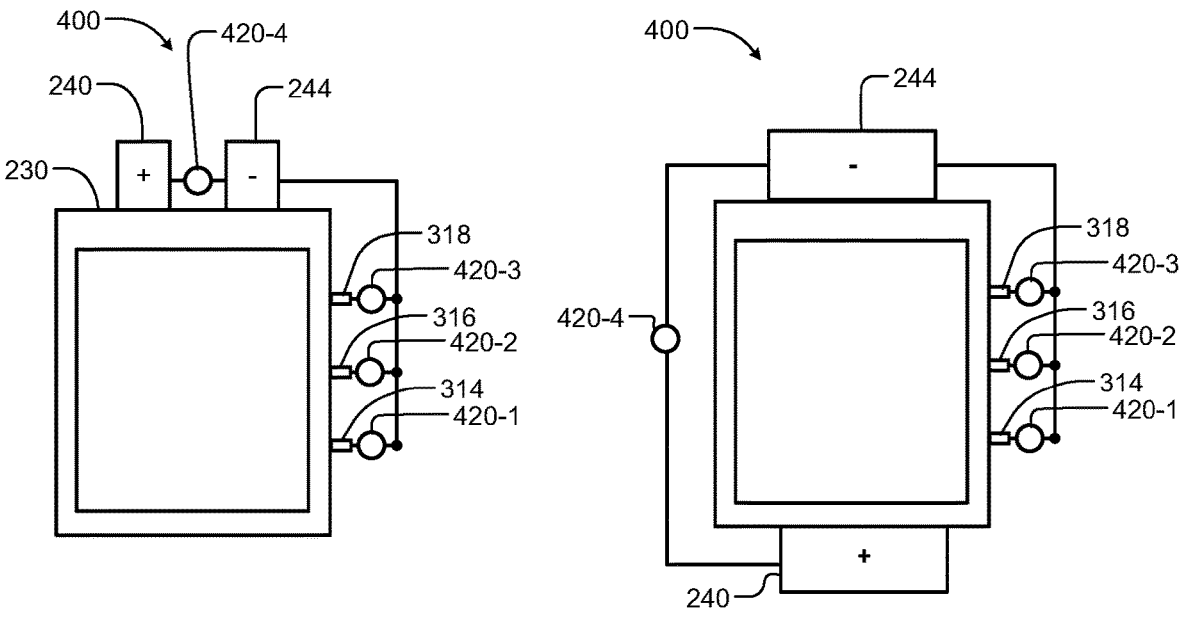
FIG. 9          FIG. 10

FIG. 11
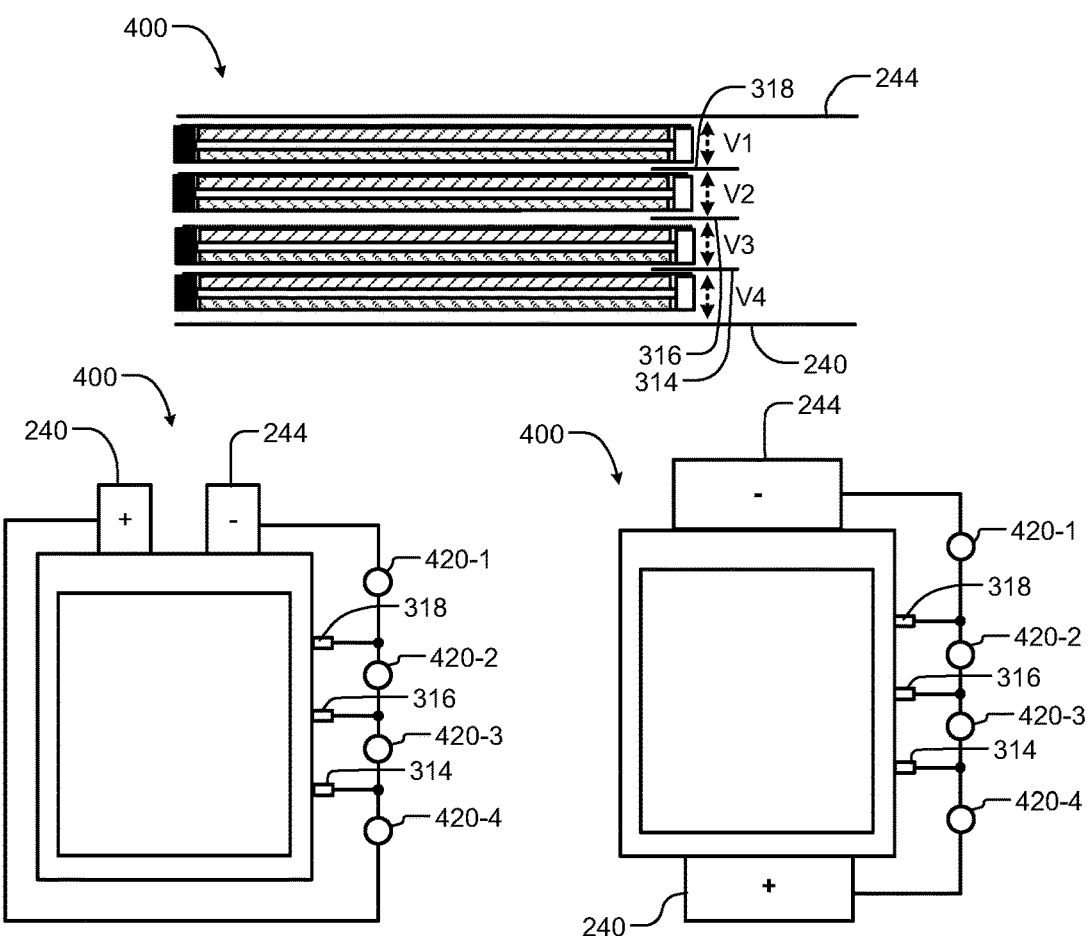
FIG. 12          ## FIG. 13
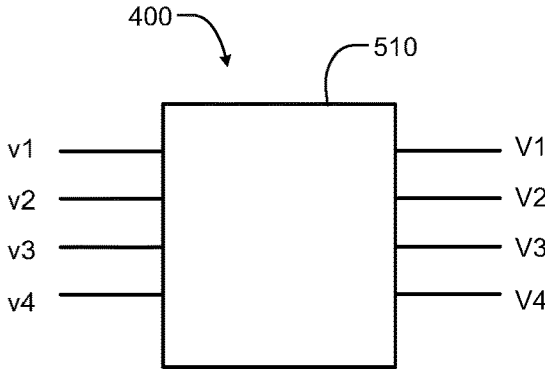
FIG. 14

BATTERY MONITORING SYSTEM FOR BIPOLAR BATTERIES

CROSS-REFERENCE TO RELATED APPLICATIONS

This application claims the benefit of Chinese patent application Ser. No. 202310119970.2, filed on Feb. 14, 2023. The entire disclosure of the application referenced above is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to battery monitoring systems, and more particularly to battery monitoring systems for bipolar batteries.

Low voltage automotive battery systems such as 12V battery systems can be used for starting vehicles, supporting stop/start functionality, and/or supplying vehicle accessory loads or other vehicle systems. Low voltage automotive battery systems can also be used to support vehicle accessory loads in electric vehicles (EVs) such as battery electric vehicles, hybrid vehicles and/or fuel cell vehicles.

During cold starting or stop/start events, the battery system supplies current to a starter to crank the engine. When the vehicle is cold started, the battery needs to supply sufficient cranking power. In some applications, the battery system may continue to supply power for various electrical systems of the vehicle after the engine is started. An alternator or regeneration recharges the battery system.

State-of-the art low voltage automotive battery systems have relatively low energy density as compared to battery systems used in other applications. Bipolar battery cells include cathode and anode electrodes arranged on opposite sides of the same current collector to enhance the energy density of the low voltage battery systems. Power response is improved due to the shortened electronic transport distance. However, cell consistency is an issue in a bipolar cell structure.

SUMMARY

A bipolar battery system includes N battery cells, where N is an integer greater than one. Each of the N battery cells comprises M cores each comprising a first current collector, cathode active material, a separator, anode active material, and a second current collector, where M is an integer greater than one. The M cores are connected in parallel by connecting the first current collectors of the M cores in each of the N battery cells together and by connecting the second current collectors of the M cores in each of the N battery cells together. N−1 clad plates include a first side made of a first material and a second side made of a second material. The N−1 clad plates are arranged between adjacent ones of the N battery cells and the N battery cells are connected in series by the N−1 clad plates. The N battery cells and the N−1 clad plates are arranged in a battery enclosure. A first terminal extends through the battery enclosure and in contact with the first current collector of a first one of the N battery cells. A second terminal extends through the battery enclosure and in contact with the second current collector of a last one of the N battery cells. N−1 tabs extending through the battery enclosure and connected to the N−1 clad plates, respectively. A voltage sensing system connects to the N−1 tabs, the first terminal, and the second terminal and is configured to determine N voltages across the N battery cells, respectively.

In other features, the first terminal and the second terminal are arranged on opposite sides of the battery enclosure. The first terminal and the second terminal are arranged on a same side of the battery enclosure. The voltage sensing system comprises N voltage sensors.

In other features, a first one of the N voltage sensors is connected between the first terminal and a first one of the N−1 tabs, a second one to an $(N-1)^{th}$ one of the N voltage sensors are connected between the N−1 tabs, respectively, and an $N^{th}$ one of the N voltage sensors is connected between the second terminal and one of the N−1 tabs.

In other features, a first one of the N voltage sensors is connected between the first terminal and the second terminal, and a second one to an $N^{th}$ one of the N voltage sensors are connected between the N−1 tabs and the second terminal.

In other features, a controller configured to calculate N voltages across the N battery cells in response to voltages output by the N voltage sensors. The controller is configured to calculate a first voltage across a first one of the N battery cells based on a first voltage sensed by a first one of the N voltage sensors, calculate a second voltage across a second one of the N battery cells based on a difference between a voltage sensed by a second one of the N voltage sensors and the first voltage, and calculate an $M^{th}$ voltage across an $M^{th}$ one of the N battery cells based on a difference between a voltage sensed by an $M^{th}$ one of the N voltage sensors and an $(M-1)^{th}$ voltage.

In other features, the controller is configured to adjust charging or discharging thresholds of the bipolar battery system in response to a difference between a measured voltage of one or more of the N battery cells relative to one or more others of the N battery cells. The controller is configured to disconnect at least one of the first terminal and the second terminal in response to a difference between a measured voltage of one or more of the N battery cells relative to one or more others of the N battery cells.

A bipolar battery system includes N battery cells, where N is an integer greater than one. Each of the N battery cells comprises M cores each comprising a first current collector, cathode active material, a separator, anode active material, and a second current collector, where M is an integer greater than one. The M cores are connected in parallel by connecting the first current collectors of the M cores in each of the N battery cells together and by connecting the second current collectors of the M cores in each of the N battery cells together. N−1 clad plates including a first side made of a first material and a second side made of a second material. The N−1 clad plates are arranged between adjacent ones of the N battery cells and the N battery cells are connected in series by the N−1 clad plates. The N battery cells and the N−1 clad plates are arranged in a battery enclosure. A first terminal extending through the battery enclosure and in contact with the first current collector of a first one of the N battery cells. A second terminal extending through the battery enclosure and in contact with the second current collector of a last one of the N battery cells. N−1 tabs extend through the battery enclosure and connected to the N−1 clad plates, respectively. A voltage sensing system is connected to the N−1 tabs, the first terminal, and the second terminal and configured to determine N voltages across the N battery cells, respectively. The voltage sensing system comprises N voltage sensors. A first one of the N voltage sensors is connected between the first terminal and a first one of the N−1 tabs, a second one to an $(N-1)^{th}$ one of the N voltage sensors are connected between the N−1 tabs, respectively, and an $N^{th}$ one of the N voltage sensors is connected between the second terminal and one of the N−1 tabs.

In other features, the first terminal and the second terminal are arranged on opposite sides of the battery enclosure. The first terminal and the second terminal are arranged on a same side of the battery enclosure. A controller is configured to at least one of adjust charging or discharging thresholds of the bipolar battery system in response to a difference between a measured voltage of one or more of the N battery cells relative to one or more others of the N battery cells, and disconnect at least one of the first terminal and the second terminal in response to a difference between a measured voltage of one or more of the N battery cells relative to one or more others of the N battery cells.

A bipolar battery system comprises N battery cells, where N is an integer greater than one. Each of the N battery cells comprises M cores each comprising a first current collector, cathode active material, a separator, anode active material, and a second current collector, where M is an integer greater than one. The M cores are connected in parallel by connecting the first current collectors of the M cores in each of the N battery cells together and by connecting the second current collectors of the M cores in each of the N battery cells together. N−1 clad plates include a first side made of a first material and a second side made of a second material. The N−1 clad plates are arranged between adjacent ones of the N battery cells and the N battery cells are connected in series by the N−1 clad plates. The N battery cells and the N−1 clad plates are arranged in a battery enclosure. A first terminal extends through the battery enclosure and in contact with the first current collector of a first one of the N battery cells. A second terminal extends through the battery enclosure and in contact with the second current collector of a last one of the N battery cells. N−1 tabs extending through the battery enclosure and connected to the N−1 clad plates, respectively. A voltage sensing system comprises N voltage sensors connected to the N−1 tabs, the first terminal, and the second terminal and configured to determine N voltages across the N battery cells, respectively. A first one of the N voltage sensors is connected between the first terminal and the second terminal, and a second one to an Nth one of the N voltage sensors are connected between the N−1 tabs and the second terminal.

In other features, the first terminal and the second terminal are arranged on opposite sides of the battery enclosure. The first terminal and the second terminal are arranged on a same side of the battery enclosure. A controller is configured to calculate a first voltage across a first one of the N battery cells based on a first voltage sensed by a first one of the N voltage sensors, and calculate a second voltage across a second one of the N battery cells based on a difference between a voltage sensed by a second one of the N voltage sensors and the first voltage, and calculate an $M^{th}$ voltage across an $M^{th}$ one of the N battery cells based on a difference between a voltage sensed by an $M^{th}$ one of the N voltage sensors and an $(M-1)^{th}$ voltage.

In other features, the controller is further configured to adjust charging or discharging thresholds of the bipolar battery system in response to a difference between a measured voltage of one or more of the N battery cells relative to one or more others of the N battery cells. The controller is further configured to disconnect at least one of the first terminal and the second terminal in response to a difference between a measured voltage of one or more of the N battery cells relative to one or more others of the N battery cells.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 7 is a side cross-sectional view illustrating an example of voltage measurement of the bipolar battery cell according to the present disclosure;

FIG. 8 illustrates an example of attachment of tabs on a cover of the battery cell to a current collector according to the present disclosure;

FIGS. 9 and 10 illustrate an example of arrangement of terminals, tabs, and voltage sensors on the battery cell enclosure according to the present disclosure;

FIG. 11 is a side cross-sectional view illustrating an example of voltage measurement of the bipolar battery cell according to the present disclosure;

FIGS. 12 and 13 illustrate an example of arrangement of terminals, tabs, and voltage sensors on the battery cell enclosure according to the present disclosure; and FIG. 14 is a functional block diagram of an example of a controller according to the present disclosure.

In the drawings, reference numbers may be reused to identify similar and/or identical elements.

DETAILED DESCRIPTION

While the bipolar battery and battery monitoring system according to the present disclosure are described below in the context of a vehicle, the bipolar battery and battery monitoring system according to the present disclosure can be used in other applications.

Battery cell consistency can be an issue for bipolar battery cells with bipolar electrodes including cathode and anode layers coated on opposite sides of a clad current collector. Problems, such as over-charging, over-discharging, gassing, internal short circuits, and other issues may occur. A battery monitoring system according to the present disclosure monitors voltages of battery cells in a bipolar battery to determine a state of health (SOH) of the bipolar battery.

Figure 1:
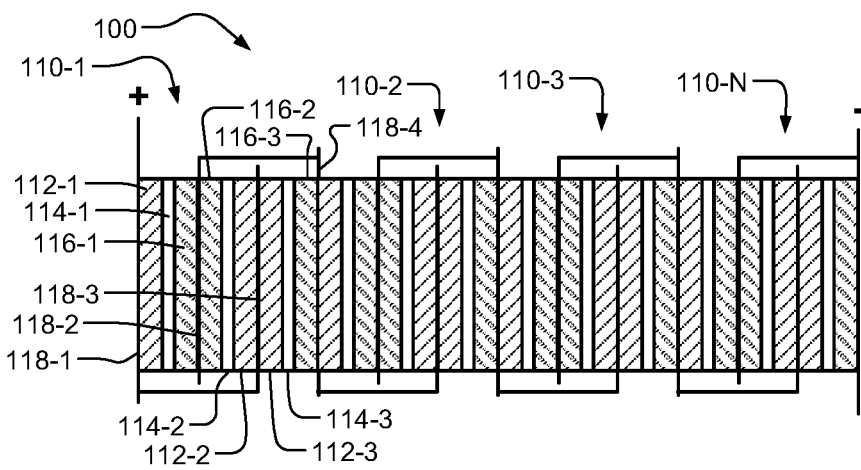
FIG. 1 is a side cross-sectional view of an example of a bipolar battery module cell core according to the present disclosure.
Figure 2:
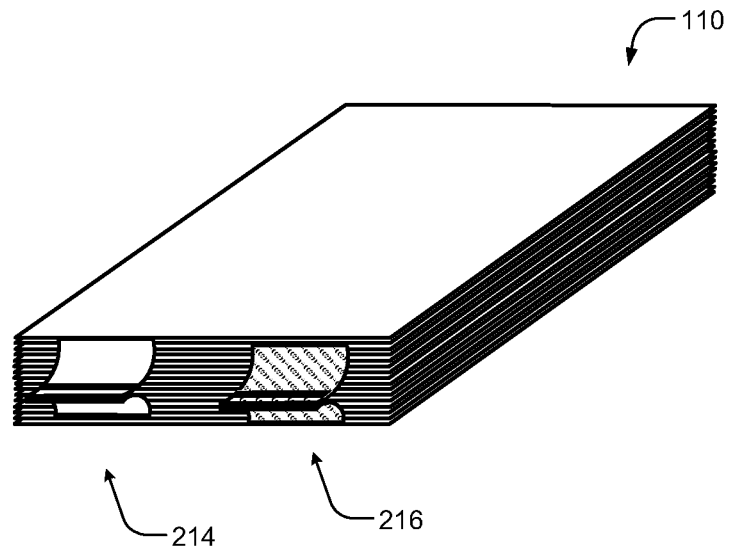
FIG. 2 is a perspective view of an example of a bipolar battery module cell core including a stack of electrodes and external tabs according to the present disclosure.

Referring now to FIGS. 1 and 2, an example of a bipolar battery module cell core 100 including cell units 110-1, 110-2, 110-3, . . . , and 110-N is shown. In this example, each of the cell units 110-1, 110-2, 110-3, . . . , and 110-N includes a current collector 118-1, a cathode electrode 112-1 between the current collector 118-1 and a separator 114-1. An anode electrode 116-1 is arranged adjacent to the separator 114-1. A current collector 118-2 is arranged adjacent to the anode electrode 116-1.

An anode electrode 116-2 is arranged adjacent to the current collector 118-2. A separator 114-2 is arranged adjacent to the anode electrode 116-2. A cathode electrode 112-2 is arranged adjacent to the separator 114-2. A current collector 118-3 is arranged adjacent to the cathode electrode 112-2. A cathode electrode 112-3 is arranged between the current collector 118-3 and a separator 114-3. An anode electrode 116-3 is arranged adjacent to the separator 114-3. A current collector 118-4 is arranged adjacent to the anode electrode 116-3.

The current collectors 118-2 and 118-4 are connected together or shorted. The current collectors 118-1 and 118-3 are connected together or shorted. In some examples, external terminals of the current collectors are connected together as will be described further below. While each of the bipolar battery module cell core 110 are shown to include three pairs of anode electrodes and cathode electrodes, additional pairs can be used and connected in a similar manner.

N bipolar battery module cell cores are connected in series between the positive and negative terminals. In some examples, N=4, although additional or fewer bipolar battery cells can be used.

The bipolar battery module comprises clad current collectors arranged therebetween adjacent bipolar battery module cell cores since terminal anode of a first bipolar battery module cell core and terminal cathode of the adjacent bipolar battery module cell core are arranged on opposite sides thereof.

In FIG. 2, one of the bipolar battery module cell core 110 is shown and includes a stack of anode electrodes with external tabs 214, cathode electrodes with external tabs 216, and separators (not shown). Additional details relating to the bipolar battery can be found in U.S. patent application Ser. No. 17/961,804, entitled "Tab Free Bipolar Solid-State Battery", filed on Oct. 7, 2022, which is incorporated herein by reference in its entirety.

Figure 3:
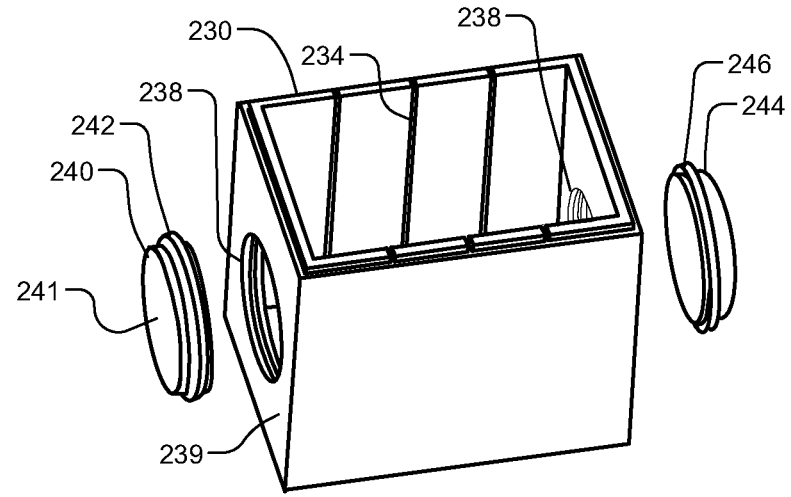
FIG. 3 is a perspective view of an example of a battery enclosure for a bipolar battery module according to the present disclosure.

Referring now to FIG. 3, a battery module enclosure 230 is shown. An opening 238 is arranged in an end wall 239 and is configured to receive a terminal 240. In some examples, the battery module enclosure 230 is injection molded around the terminal 240. In some examples, the terminal 240 comprises a flat cylinder 241 and a flange 242 extending radially outwardly therefrom. The flange 242 helps to retain the terminal 240 in the opening 238 after molding. A terminal 244 is likewise arranged in the opening 238 on an opposite end wall. In some examples, the terminal 244 includes a flat cylinder and a flange 246 extending radially outwardly therefrom. In some examples, the positive terminal (e.g., terminal 240 or 244) is made of a material selected from a group consisting of stainless steel, aluminum, nickel, iron, titanium, tin, and alloys thereof. In some examples, the negative terminal (e.g., terminal 244 or 240) is made of a material selected from a group consisting of stainless steel, copper, nickel, iron, titanium, tin, and alloys thereof. Clad current collectors (shown in FIGS. 4 to 6) are received in slots 234 on inner surfaces of the battery module enclosure 230.

Figure 4:
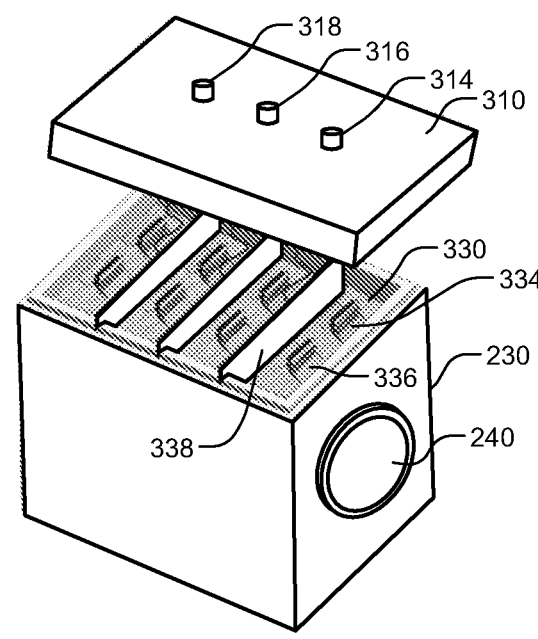
FIG. 4 is a perspective view of an example of a battery enclosure with lid and assisted tabs on the lid for a bipolar battery module according to the present disclosure.

Referring now to FIG. 4, a lid 310 is arranged over the battery module enclosure 230 and includes tabs 314, 316 and 318 connected to some of the clad current collectors. Bipolar battery module cell cores 330 including external tabs 334 and 336 are arranged between clad current collectors 338. In some examples, the clad current collectors 338 include a cathode current collector side 412 made of a first material and an anode current collector 414 made of a second material (e.g., materials for the positive and negative terminals described above). External tabs 334 corresponding to cathode electrodes (or a corresponding side of the clad current collectors 338) are connected to the tabs 314, 316 and 318. A remaining one of the cathode electrodes is connected to one of the terminals 240.

Figures 5, 6:
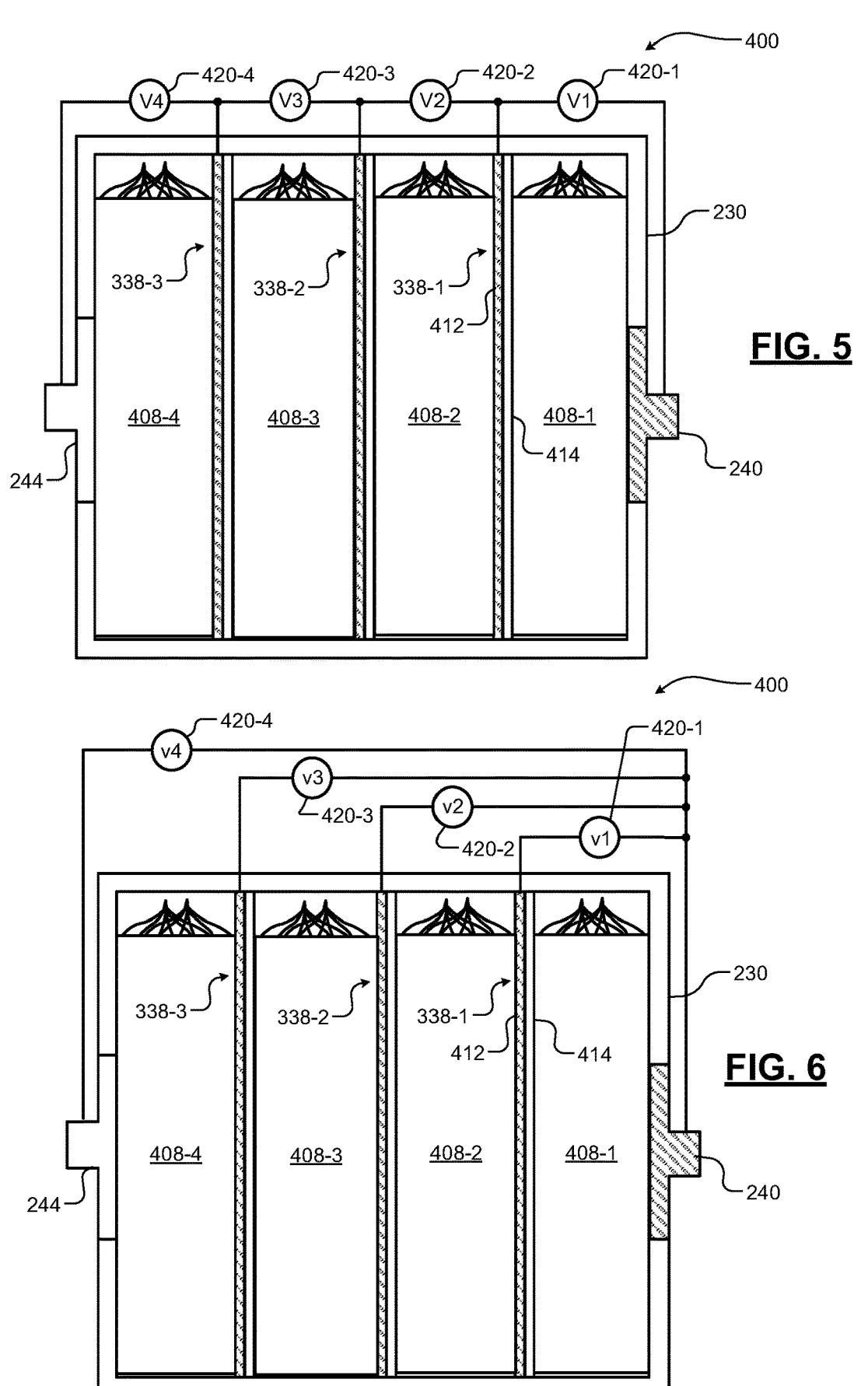
FIGS. 5 and 6 are side cross-sectional views of an example of a battery monitoring system for the bipolar battery module according to the present disclosure.

Referring now to FIG. 5, a voltage sensing system 400 includes voltage sensors 420 (e.g., voltage sensors 420-1, 420-1, 420-3 and 420-4) to sense voltages (e.g., V1, V2, V3, and V4) across bipolar battery module cell cores 408 (e.g., bipolar battery module cell cores 408-1, 408-1, 408-3 and 408-4). More particularly, the voltage sensor 420-1 is connected between the terminal 240 and a cathode current collector side 412 of the clad current collector 338-1. The voltage sensor 420-2 is connected between the cathode current collector side 412 of the clad current collector 338-1 and the cathode current collector side 412 of the clad current collector 338-2. The voltage sensor 420-3 is connected between the cathode current collector side 412 of the clad current collector 338-2 and the cathode current collector side 412 of the clad current collector 338-3. The voltage sensor 420-4 is connected between the cathode current collector side 412 of the clad current collector 338-3 and the terminal 244.

Referring now to FIG. 6, the voltage sensors 420 sense absolute voltages (e.g., v1, v2, v3, and v4) at the tabs or terminals rather than differential voltages (e.g., V1, V2, V3, and V4) across each of the battery cells. The voltage V1 corresponds to the voltage v1 across the first battery cell since v1 is a measure of voltage of the first battery cell relative to ground. The voltage V2 across the second battery cell is calculated by taking the difference between v2 and v1, the voltage V3 across the third battery cell is calculated by taking the difference between v3 and v2, the voltage V4 across the fourth battery cell is calculated by taking the difference between v4 and v3, etc.

More particularly, the voltage sensor 420-1 is connected between the terminal 240 and the cathode current collector side 412 of the clad current collector 338-1. The voltage sensor 420-2 is connected between the terminal 240 and the cathode current collector side 412 of the clad current collector 338-2. The voltage sensor 420-3 is connected between the terminal 240 and a cathode current collector side 412 of the clad current collector 338-3. The voltage sensor 420-4 is connected between the terminal 240 and the terminal 244.

In FIG. 7, the voltage across an individual bipolar battery cell units 408 are determined as follows. The voltage V1 across the bipolar battery cell unit 408-1 corresponds to the voltage v1 measured by the voltage sensor 420-1. The voltage V2 across the bipolar battery cell unit 408-2 corresponds to a difference between the voltage v2 measured by the voltage sensor 420-2 and v1. The voltage V3 across the bipolar battery cell-unit 408-3 corresponds to a difference between the voltage v3 measured by the voltage sensor 420-3 and v2. The voltage V4 across the bipolar battery cell unit 408-4 corresponds to a difference between the voltage v4 measured by the voltage sensor 420-4 and v3.

Referring now to FIG. 8, an example connection is shown between one of the tabs 314 extending through the lid and the cathode current collector side 412 of the clad current collector 338.

Referring now to FIGS. 9 and 10, additional locations for the terminals and tabs are shown for the case where the absolute voltages are measured, and differences are generated to determine the voltage across each of the bipolar battery cell units. In FIG. 9, the terminals 240 and 244 are arranged on the same side of the battery module enclosure 230. In FIG. 10, the terminals 240 and 244 are located on opposite sides of the battery module enclosure 230. The voltage sensors are arranged between the tabs 314, 316 and 318 and the terminal 244 or between the terminals 244 and 240.

Referring now to FIGS. 11 to 13, additional locations for the terminals and tabs are shown for the case where the differential voltages are directly measured. In FIG. 12, the terminals 240 and 244 are arranged on the same side of the battery module enclosure 230. In FIG. 13, the terminals 240 and 244 are located on opposite sides of the battery module enclosure 230. The voltage sensors 420 are arranged between the terminal 240 and the tab 314, between two tabs (314 and 316, 316 and 318), or between the tab 318 and the terminal 244.

Referring now to FIG. 14, the voltage sensing system 400 includes a controller 500 configured to calculate the voltage across the bipolar battery cells based on (e.g., v1, v2, v3, and v4) as shown above.

In some examples, the controller 500 is configured to determine a state of health (SOH) of the bipolar battery in response to the measured voltages across each of the bipolar battery cell cores or units. In some examples, the controller 500 is configured to adjust charging or discharging thresholds of the bipolar battery in response to a difference between a measured voltage of one or more of the battery cell cores or units relative to one or more others of the battery cell cores or units. In other examples, the controller 500 is configured to disconnect one or both of the terminals of the bipolar battery in response to a difference between a measured voltage of one or more of the battery cell cores or units relative to one or more others of the battery cell cores or units.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A bipolar battery system comprising:
N battery cells, where N is an integer greater than one, wherein each of the N battery cells comprises:
M cores each comprising a first current collector, cathode active material, a separator, anode active material, and a second current collector, where M is an integer greater than one,
wherein the M cores are connected in parallel by connecting the first current collectors of the M cores in each of the N battery cells together and by connecting the second current collectors of the M cores in each of the N battery cells together; and
N−1 clad plates including first sides made of a first material and second sides made of a second material, wherein the N−1 clad plates are arranged between adjacent ones of the N battery cells and the N battery cells are connected in series by the N−1 clad plates,
a battery enclosure including a base and a lid arranged over the base, wherein the N battery cells and the N−1 clad plates are arranged in the battery enclosure, wherein the base includes an inner surface defining slots, and wherein the N−1 clad plates are arranged in the slots, wherein the lid includes N−1 tabs extending through opposing sides of the lid and are connected to the first sides of the N−1 clad plates, respectively;
a first terminal extending through the base of the battery enclosure and in contact with the first current collector of a first one of the N battery cells;
a second terminal extending through the base of the battery enclosure and in contact with the second current collector of a last one of the N battery cells; and
a voltage sensing system connected to the N−1 tabs, the first terminal, and the second terminal and configured to determine N voltages across the N battery cells, respectively.

2. The bipolar battery system of claim 1, wherein the first terminal and the second terminal are arranged on opposite sides of the base of the battery enclosure.

3. The bipolar battery system of claim 1, wherein the first terminal and the second terminal are arranged on a same side of the base of the battery enclosure.

4. The bipolar battery system of claim 1, wherein the voltage sensing system comprises N voltage sensors.

5. The bipolar battery system of claim 4, wherein:
a first one of the N voltage sensors is connected between the first terminal and a first one of the N−1 tabs,
a second one to an $(N−1)^{th}$ one of the N voltage sensors are connected between the N−1 tabs, respectively, and
an $N^{th}$ one of the N voltage sensors is connected between the second terminal and one of the N−1 tabs.

6. The bipolar battery system of claim 4, wherein:
a first one of the N voltage sensors is connected between the first terminal and the second terminal, and
a second one to an $N^{th}$ one of the N voltage sensors are connected between the N−1 tabs and the second terminal.

7. The bipolar battery system of claim 6, further comprising a controller configured to calculate N voltages across the N battery cells in response to voltages output by the N voltage sensors.

8. The bipolar battery system of claim 7, wherein the controller is configured to:
calculate a first voltage across a first one of the N battery cells based on a first voltage sensed by a first one of the N voltage sensors,
calculate a second voltage across a second one of the N battery cells based on a difference between a voltage sensed by a second one of the N voltage sensors and the first voltage, and
calculate an $M^{th}$ voltage across an $M^{th}$ one of the N battery cells based on a difference between a voltage sensed by an $M^{th}$ one of the N voltage sensors and an $(M−1)^{th}$ voltage.

9. The bipolar battery system of claim 7, wherein the controller is configured to adjust charging or discharging thresholds of the bipolar battery system in response to a difference between a measured voltage of one or more of the N battery cells relative to one or more others of the N battery cells.

10. The bipolar battery system of claim 7, wherein the controller is configured to disconnect at least one of the first terminal and the second terminal in response to a difference between a measured voltage of one or more of the N battery cells relative to one or more others of the N battery cells.

11. A bipolar battery system comprising:
N battery cells, where N is an integer greater than one, wherein each of the N battery cells comprises:
M cores each comprising a first current collector, cathode active material, a separator, anode active material, and a second current collector, where M is an integer greater than one, wherein the M cores are connected in parallel by connecting the first current collectors of the M cores in each of the N battery cells together and by connecting the second current collectors of the M cores in each of the N battery cells together;

N−1 clad plates including a first side made of a first material and a second side made of a second material, wherein the N−1 clad plates are arranged between adjacent ones of the N battery cells and the N battery cells are connected in series by the N−1 clad plates;

a battery enclosure including a base and a lid arranged over the base, wherein the N battery cells and the N−1 clad plates are arranged in the battery enclosure, wherein the base includes an inner surface defining slots, and wherein the N−1 clad plates are arranged in the slots, wherein the lid includes N−1 tabs extending through opposing sides of the lid and are connected to the first sides of the N−1 clad plates, respectively;

a first terminal extending through the base of the battery enclosure and in contact with the first current collector of a first one of the N battery cells;

a second terminal extending through the base of the battery enclosure and in contact with the second current collector of a last one of the N battery cells; and a voltage sensing system connected to the N−1 tabs, the first terminal, and the second terminal and configured to determine N voltages across the N battery cells, respectively, wherein the voltage sensing system comprises N voltage sensors, and wherein a first one of the N voltage sensors is connected between the first terminal and a first one of the N−1 tabs, a second one to an $(N-1)^{th}$ one of the N voltage sensors are connected between two adjacent tabs of the N−1 tabs, respectively, and an $N^{th}$ one of the N voltage sensors is connected between the second terminal and one of the N−1 tabs.

12. The bipolar battery system of claim 11, wherein the first terminal and the second terminal are arranged on opposite sides of the base of the battery enclosure.

13. The bipolar battery system of claim 11, wherein the first terminal and the second terminal are arranged on a same side of the base of the battery enclosure.

14. The bipolar battery system of claim 11, further comprising a controller configured to at least one of:

adjust charging or discharging thresholds of the bipolar battery system in response to a difference between a measured voltage of one or more of the N battery cells relative to one or more others of the N battery cells, and disconnect at least one of the first terminal and the second terminal in response to a difference between a measured voltage of one or more of the N battery cells relative to one or more others of the N battery cells.

15. A bipolar battery system comprising:

N battery cells, where N is an integer greater than one, wherein each of the N battery cells comprises:

M cores each comprising a first current collector, cathode active material, a separator, anode active material, and a second current collector, where M is an integer greater than one, wherein the M cores are connected in parallel by connecting the first current collectors of the M cores in each of the N battery cells together and by connecting the second current collectors of the M cores in each of the N battery cells together;

N−1 clad plates including a first side made of a first material and a second side made of a second material, wherein the N−1 clad plates are arranged between adjacent ones of the N battery cells and the N battery cells are connected in series by the N−1 clad plates;

a battery enclosure including a base and a lid arranged over the base, wherein the N battery cells and the N−1 clad plates are arranged in the battery enclosure, wherein the base includes an inner surface defining slots, and wherein the N−1 clad plates are arranged in the slots, wherein the lid includes N−1 tabs extending through opposing sides of the lid and are connected to the first sides of the N−1 clad plates, respectively;

a first terminal extending through the base of the battery enclosure and in contact with the first current collector of a first one of the N battery cells;

a second terminal extending through the base of the battery enclosure and in contact with the second current collector of a last one of the N battery cells; and a voltage sensing system comprising N voltage sensors connected to the N−1 tabs, the first terminal, and the second terminal and configured to determine N voltages across the N battery cells, respectively, wherein a first one of the N voltage sensors is connected between the first terminal and the second terminal, and a second one to an $N^{th}$ one of the N voltage sensors are connected between the N−1 tabs and the second terminal.

16. The bipolar battery system of claim 15, wherein the first terminal and the second terminal are arranged on opposite sides of the base of the battery enclosure.

17. The bipolar battery system of claim 15, wherein the first terminal and the second terminal are arranged on a same side of the base of the battery enclosure.

18. The bipolar battery system of claim 15, further comprising a controller configured to:

calculate a first voltage across a first one of the N battery cells based on a first voltage sensed by a first one of the N voltage sensors, calculate a second voltage across a second one of the N battery cells based on a difference between a voltage sensed by a second one of the N voltage sensors and the first voltage, and calculate an $M^{th}$ voltage across an $M^{th}$ one of the N battery cells based on a difference between a voltage sensed by an $M^{th}$ one of the N voltage sensors and an $(M-1)^{th}$ voltage.

19. The bipolar battery system of claim 18, wherein the controller is further configured to adjust charging or discharging thresholds of the bipolar battery system in response to a difference between a measured voltage of one or more of the N battery cells relative to one or more others of the N battery cells.

20. The bipolar battery system of claim 18, wherein the controller is further configured to disconnect at least one of the first terminal and the second terminal in response to a difference between a measured voltage of one or more of the N battery cells relative to one or more others of the N battery cells.

\* \* \* \* \*